(12) United States Patent
Harvey et al.

(10) Patent No.: US 9,036,884 B2
(45) Date of Patent: May 19, 2015

(54) IMAGE INTENSITY CORRECTION FOR MAGNETIC RESONANCE IMAGING

(75) Inventors: Paul R. Harvey, Best (NL); Thomas H. Rozijn, Best (NL); Gerrit H. Ijperen, Eindhoven (NL); Willem M. Prins, Eindhoven (NL); Wilhelmus R. M. Mens, Vught (NL); Franciscus J. M. Benschop, 'S-Hertogenbosch (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 513 days.

(21) Appl. No.: 13/393,232

(22) PCT Filed: Aug. 5, 2010

(86) PCT No.: PCT/IB2010/053556
§ 371 (c)(1),
(2), (4) Date: Feb. 29, 2012

(87) PCT Pub. No.: WO2011/033401
PCT Pub. Date: Mar. 24, 2011

(65) Prior Publication Data
US 2012/0163692 A1    Jun. 28, 2012

Related U.S. Application Data

(60) Provisional application No. 61/243,193, filed on Sep. 17, 2009.

(51) Int. Cl.
G06K 9/00 (2006.01)
G01R 33/565 (2006.01)
(52) U.S. Cl.
CPC .................................. G01R 33/5659 (2013.01)
(58) Field of Classification Search
None
See application file for complete search history.

(56) References Cited

U.S. PATENT DOCUMENTS

| 6,961,455 | B2 | 11/2005 | Ma et al. |
| 7,218,109 | B2 | 5/2007 | Campagna |
| 2004/0044280 | A1* | 3/2004 | Paley et al. ................... 600/410 |
| 2004/0070394 | A1* | 4/2004 | Gonzalez Ballester et al. ............................. 324/307 |
| 2004/0152969 | A1* | 8/2004 | Zhang et al. .................. 600/422 |

(Continued)

FOREIGN PATENT DOCUMENTS

| DE | 102005039686 B3 | 5/2007 |
| WO | 2006067727 A2 | 6/2006 |

OTHER PUBLICATIONS

Adriany, G., et al.; Transmit and Receive Transmission Line Arrays for 7 Tesla Parallel Imaging; 2005; MRM; 53:434-445.

(Continued)

Primary Examiner — Matthew Bella
Assistant Examiner — Jason Heidemann

(57) ABSTRACT

A magnetic resonance system includes a magnetic resonance scanner having a multi-channel transmit coil or coil system and a magnetic resonance receive element; and a digital processor configured to perform an imaging process. The image process includes shimming the multi-channel transmit coil or coil system, acquiring a coil sensitivity map for the magnetic resonance receive element using the multi-channel transmit coil or coil system, acquiring a magnetic resonance image using the magnetic resonance receive element and the shimmed multi-channel transmit coil or coil system, and performing an intensity level correction on the acquired magnetic resonance image using the coil sensitivity map to generate a corrected magnetic resonance image.

18 Claims, 2 Drawing Sheets

(56) References Cited

U.S. PATENT DOCUMENTS

Figure 1:
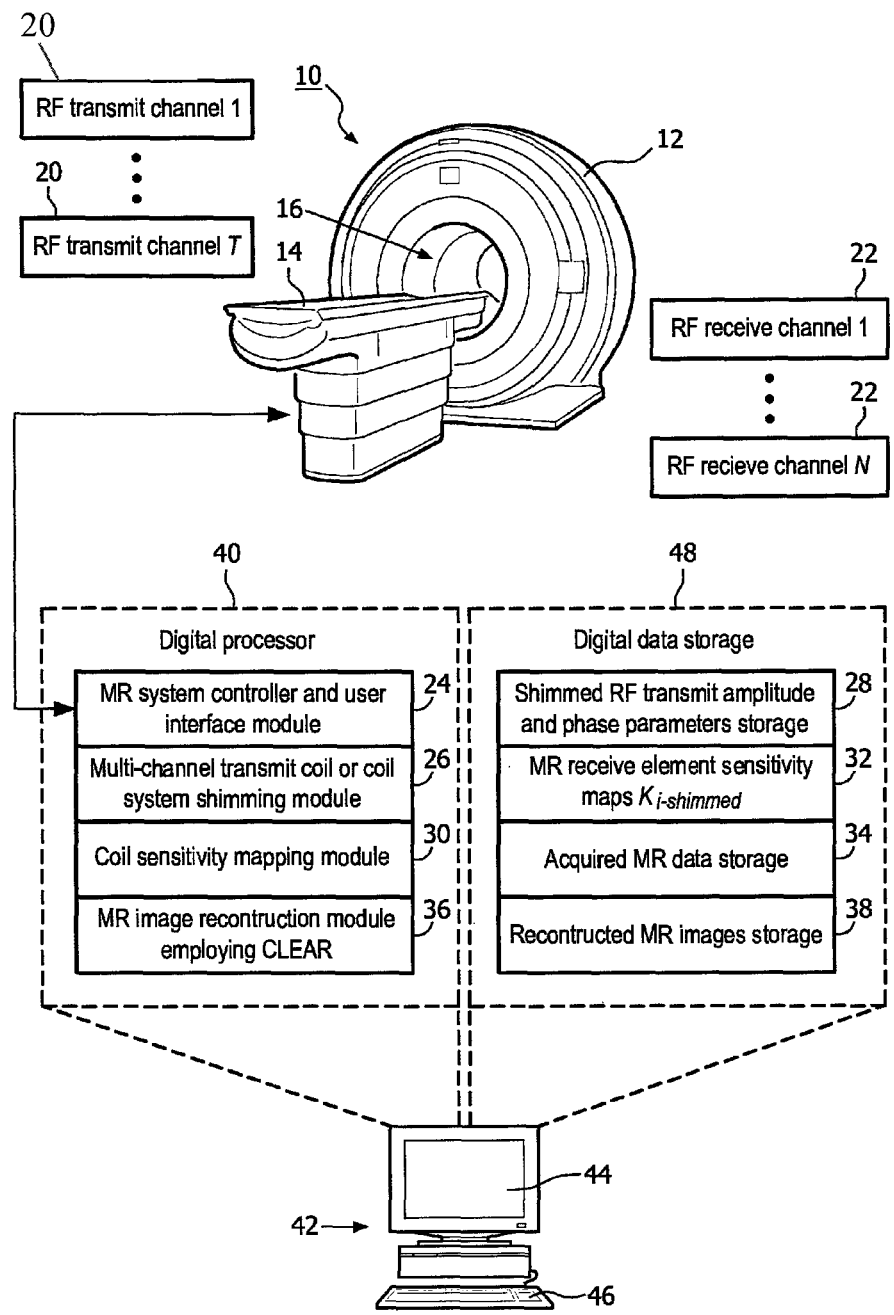

| | | | |
|---|---|---|---|
| 2005/0099178 A1* | 5/2005 | King et al. | 324/309 |
| 2006/0106299 A1 | 5/2006 | Uchizono | |
| 2007/0108980 A1* | 5/2007 | Adriany et al. | 324/318 |
| 2008/0129298 A1* | 6/2008 | Vaughan et al. | 324/322 |
| 2008/0211501 A1 | 9/2008 | Graesslin et al. | |
| 2008/0310695 A1* | 12/2008 | Garnier et al. | 382/131 |
| 2009/0224756 A1* | 9/2009 | Machida et al. | 324/300 |
| 2009/0309594 A1 | 12/2009 | Feiweier | |
| 2011/0156704 A1* | 6/2011 | Boernert et al. | 324/309 |

OTHER PUBLICATIONS

Bernstein, M. A., et al.; Imaging Artifacts at 3.0T; 2006; J. of Magnetic Resonance Imaging; 24:735-746.

Snyder, C. J., et al.; Separate Transmit and Receive Arrays for 7T Body Imaging; 2008; Proc. Intl. Soc. Mag. Reson. Med.; 16:1065.

Wang, J., et al.; In Vivo Method for Correcting Transmit/Receive Nonuniformities with Phased Array Coils; 2005; MRM; 53:666-674.

* cited by examiner

IMAGE INTENSITY CORRECTION FOR MAGNETIC RESONANCE IMAGING

CROSS REFERENCE TO RELATED APPLICATIONS

This application claims the benefit of U.S. provisional application Ser. No. 61/243,193 filed Sep. 17, 2009, which is incorporated herein by reference.

The following relates to the magnetic resonance arts, medical imaging arts, and related arts.

Parallel magnetic resonance (MR) imaging, such as sensitivity encoding (SENSE) MR imaging, utilizes additional information provided by the use of multiple MR receive coils (or, more generally, MR receive elements) to provide faster and/or higher resolution imaging. In essence, parallel imaging techniques such as SENSE take coil nonuniformity, which is usually viewed as a problem, and turn it to good use.

Toward this end, it is known to perform MR receive coil sensitivity mapping using a sequence in which a whole-body transmit coil is used for MR excitation and the MR signals received by the MR receive element are used to generate coil sensitivity maps. Without loss of generality, the number of MR receive elements is denoted herein by N, and the MR receive elements are indexed by index i where i=1, ..., N. The coil sensitivity at a spatial point (x, y, z) for the $i^{th}$ MR receive element is denoted $S_i^{Rx}(x, y, z)$, where the superscript "Rx" denotes a receive field. The sensitivity mapping typically employs a quadrature body coil (QBC) as the transmit coil, and is performed with the subject loaded in order to account for subject loading effects. The subject contrast is denoted herein as Contrast(x, y, z). The QBC transmit sensitivity is expected to be substantially uniform as compared with the MR receive elements due to the QBC being typically substantially larger than the MR receive elements. For example, the QBC may be a cylindrical whole-body birdcage or transverse electromagnetic (TEM) coil surrounding the field of view (FOV); whereas, individual MR receive elements may be local loop coils of one or a few turns, individual rod elements, or so forth.

In the coil sensitivity mapping, an image is acquired with the subject loaded using the N MR receive elements and also using the QBC. The intensity distribution acquired by the QBC is expected to be determined by the subject contrast, that is, $I_{QBC}^{Rx}(x, y, z) \propto$ Contrast(x, y, z). The intensity distribution acquired by the MR receive elements is expected to be determined by the subject contrast and also by the MR receive element coil sensitivity, that is, $I_i^{Rx}(x, y, z) \propto S_i^{Rx}(x, y, z) \cdot$ Contrast(x, y, z) for the $i^{th}$ MR receive element. Since both intensity distributions $I_i^{Rx}(x, y, z)$ and $I_{QBC}^{Rx}(x, y, z)$ are measured during the coil sensitivity mapping acquisition, the coil sensitivity for the $i^{th}$ MR receive element is determined as:

$$S_i^{Rx}(x, y, z) = \frac{I_i^{Rx}(x, y, z)}{I_{QBC}^{Rx}(x, y, z)} \quad (1)$$

Dividing by the intensity distribution acquired by the QBC removes the subject contrast from the intensity distribution, leaving only the coil sensitivity map $S_i^{Rx}(x, y, z)$.

Although useful in SENSE and other parallel imaging techniques, the coil sensitivity map $S_i^{Rx}(x, y, z)$ is more generally useful to perform intensity level correction so as to correct the image for coil non-uniformity. Magnetic resonance imaging data acquired by an MR receive element are reconstructed to form an (uncorrected) image intensity distribution $I_i^{Image}(x, y, z) = S_i^{Rx}(x, y, z) \cdot$ Contrast(x, y, z). In a technique known as constant level appearance (CLEAR), the imaging intensity distribution is made more uniform by dividing out the coil sensitivity, that is:

$$I_i^{CLEAR}(x, y, z) = \frac{I_i^{Image}(x, y, z)}{S_i^{Rx}(x, y, z)}. \quad (2)$$

In the case of SENSE, this intensity level correction is performed for each of a plurality of MR receive elements, and additionally the acquisitions are undersampled and the information from the plurality of MR receive elements used to compensate for the missing data caused by the undersampling.

In practice, however, it is sometimes found that CLEAR-corrected images exhibit signal voids, ghosting, or other image artifacts. Such defects generally become more pronounced for imaging performed at higher magnetic field. It is known that subject tissue conductivity and spatial field non-uniformity tend to become more problematic at higher magnetic field. However, the CLEAR correction is expected to compensate for such non-uniformity. Thus, the presence of signal voids, ghosting, or other image artifacts in CLEAR-corrected images is surprising and problematic.

The following provides new and improved apparatuses and methods which overcome the above-referenced problems and others.

In accordance with one disclosed aspect, a magnetic resonance method comprises: shimming a multi-channel transmit coil or coil system to determine optimized operating parameters for radio frequency transmit channels of the multi-channel transmit coil or coil system; acquiring a coil sensitivity map for a magnetic resonance receive element using the multi-channel transmit coil or coil system; acquiring magnetic resonance imaging data using the magnetic resonance receive element and the multi-channel transmit coil or coil system operated with the optimized operating parameters determined by the shimming; and reconstructing a magnetic resonance image from the acquired magnetic resonance imaging data, the reconstructing including performing an intensity level correction using the coil sensitivity map acquired using the multi-channel transmit coil or coil system operating with the optimized operating parameters determined by the shimming.

In accordance with another disclosed aspect, a digital processor is configured to perform a magnetic resonance method as set forth in the immediately preceding paragraph in cooperation with a magnetic resonance scanner including the multi-channel transmit coil or coil system and the magnetic resonance receive element. In accordance with another disclosed aspect, a storage medium stores instructions that are executable on a digital processor to perform a magnetic resonance method as set forth in the immediately preceding paragraph in cooperation with a magnetic resonance scanner including the multi channel transmit coil or coil system and the magnetic resonance receive element.

In accordance with another disclosed aspect, a magnetic resonance system comprises: a magnetic resonance scanner including a multi-channel transmit coil or coil system and a magnetic resonance receive element; and a digital processor configured to perform an imaging process including shimming the multi-channel transmit coil or coil system, acquiring a coil sensitivity map for the magnetic resonance receive element using the multi-channel transmit coil or coil system, acquiring a magnetic resonance image using the magnetic resonance receive element and the shimmed multi-channel transmit coil or coil system, and performing an intensity level correction on the acquired magnetic resonance image using the coil sensitivity map to generate a corrected magnetic resonance image.

One advantage resides in providing more uniform intensity of MR images.

Another advantage resides in providing MR images with reduced artifacts.

Further advantages will be apparent to those of ordinary skill in the art upon reading and understanding the following detailed description.

FIG. 1 diagrammatically illustrates a magnetic resonance (MR) system configured to perform CLEAR-corrected imaging employing a shimmed multi-channel transmit coil or coil system.

Figure 2:
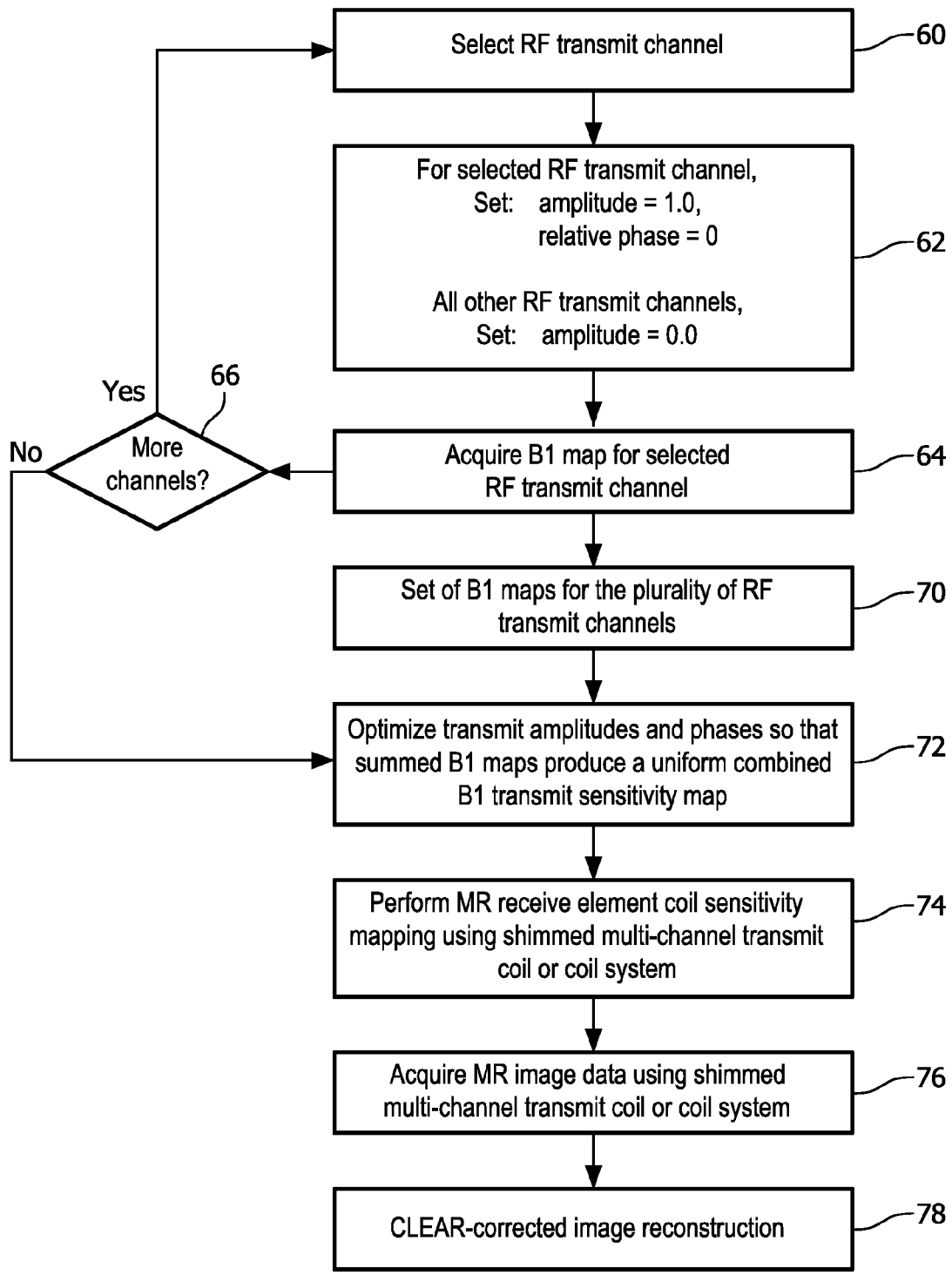

FIG. 2 diagrammatically illustrates a CLEAR-corrected imaging process employing a shimmed multi-channel transmit coil or coil system that is suitably implemented by the MR system of FIG. 1.

It is shown herein that the surprising and problematic presence of signal voids, ghosting, or other image artifacts in contrast level appearance (CLEAR)-corrected images is caused by spatial nonuniformity of the QBC (or other transmit coil). Spatial nonuniformity of the QBC is shown to be transposed into the CLEAR-corrected image in a squared fashion, due to incorporation of both the QBC transmit and QBC receive coil sensitivity maps in multiplicative fashion during CLEAR corrected image reconstruction. Even though it may be correctly assumed that the transmit coil sensitivity is substantially more uniform than that of the MR receive coil elements, failure to account for nonuniformity of the QBC coil results in substantial image artifacts, especially at higher magnetic field.

It is further disclosed herein that these image artifacts can be effectively suppressed by replacing the conventionally quadrature-driven QBC with a multi-channel transmit coil or coil system and performing shimming prior to acquiring the MR receive element sensitivity maps.

CLEAR-corrected image reconstruction is reanalyzed here with the QBC coil sensitivities explicitly taken into account. The QBC has transmit coil sensitivity $S_{QBC}^{Tx}(x, y, z)$ and receive coil sensitivity $S_{QBC}^{Rx}(x, y, z)$. With these parameters explicitly defined, the intensities can be written in terms of the transmit and receive coil sensitivities and the imaging subject contrast, denoted herein as Contrast(x, y, z), as follows:

$$I_{QBC}^{Rx}(x,y,z) \propto S_{QBC}^{Tx}(x,y,z) \cdot S_{QBC}^{Rx}(x,y,z) \cdot \text{Contrast}(x,y,z) \quad (3)$$

and $$I_i^{Rx}(x,y,z) \propto S_{QBC}^{Tx}(x,y,z) \cdot S_i^{Rx}(x,y,z) \cdot \text{Contrast}(x,y,z) \quad (4),$$

from which the following ratio can be obtained:

$$K_i(x, y, z) = \frac{I_i^{Rx}(x, y, z)}{I_{QBC}^{Rx}(x, y, z)} = \frac{S_i^{Rx}(x, y, z)}{S_{QBC}^{Rx}(x, y, z)}. \quad (5)$$

From Equation (5), it can be seen that the ratio $K_i = I_i^{Rx}/I_{QBC}^{Rx}$ which is conventionally considered to be the coil sensitivity $S_i^{Rx}(x, y, z)$ (see Equation (1)) is actually a relative coil sensitivity map that is relative to the QBC receive coil sensitivity $S_{QBC}^{Rx}(x, y, z)$.

Even given this observation, the skilled artisan might nonetheless expect the extraneous term $S_{QBC}^{Rx}(x, y, z)$ to be compensated during the intensity level correction operation. However, it is shown here that this is not the case, but that indeed to the contrary the intensity level correction operation actually squares the error.

With the insight provided by Equation (5), the intensity level correction of the image employing the constant level appearance (CLEAR) approach as set forth in Equation (2) can be more accurately written as:

$$I_i^{CLEAR}(x, y, z) = \frac{I_i^{Image}(x, y, z)}{K_i(x, y, z)}, \quad (6)$$

where the term $I_i^{Image}(x, y, z)$ is again the intensity distribution acquired by the $i^{th}$ MR receive element during imaging data acquisition. However, from Equation (4) it is recognized that $I_i^{Image}(x, y, z)$ is more accurately written as:

$$I_i^{Image}(x,y,z) \propto S_{QBC}^{Tx}(x,y,z) \cdot S_i^{Rx}(x,y,z) \cdot \text{Contrast}(x,y,z) \quad (7),$$

where proportionality of $I_i^{Image}$ to $S_{QBC}^{Tx}$ is assumed. This assumption is generally good, although the precise dependence depends secondarily on factors such as scan type and T1. Combining Equations (5), (6), and (7) provides a more accurate intensity distribution:

$$\begin{aligned} I_i^{CLEAR}(x, y, z) &= \frac{I_i^{Image}(x, y, z)}{K_i(x, y, z)} \\ &= (I_i^{Image}) \cdot \left(\frac{1}{K_i}\right) \\ &= (S_{QBC}^{Tx} \cdot S_i^{Rx} \cdot \text{Contrast}) \cdot \left(\frac{S_{QBC}^{Rx}}{S_i^{Rx}}\right) \\ &= S_{QBC}^{Tx}(x, y, z) \cdot S_{QBC}^{Rx}(x, y, z) \cdot \text{Contrast}(x, y, z), \end{aligned} \quad (8)$$

where the spatial coordinate (x, y, z) is omitted in the intermediate expressions for brevity. Assuming in accordance with the principle of reciprocity that the transmit and receive intensity distributions for the QBC are similar, that is, $S_{QBC}^{Tx}(x, y, z) \cong S_{QBC}^{Rx}(x, y, z)$, Equation (8) can be written as:

$$I_i^{CLEAR}(x,y,z) = (S_{QBC}^{Tx}(x,y,z))^2 \cdot \text{Contrast}(x,y,z) \quad (9).$$

Equation (9) shows that the CLEAR correction does (as expected) remove MR receive element non-uniformity (that is, compensates for the term $S_i^{Rx}(x, y, z)$). However, the CLEAR correction also introduces a squared MR transmit coil nonuniformity $(S_{QBC}^{Rx}(x, y, z))^2$ into the intensity distribution.

This squared MR transmit coil nonuniformity can be problematic, especially at higher magnetic field where radio frequency (RF) standing waves can play a substantial role in reducing the transmit field uniformity; moreover, due to the principle of reciprocity this nonuniformity is also introduced into the receive field of the QBC or other transmit coil, and both these terms are incorporated into the CLEAR-corrected intensity distribution. Still further, at high magnetic field the wavelength at the MR frequency can be comparable with or smaller than imaging features of interest, so that non-uniformity of the transmit field can be on a scale of the features of interest.

Recognizing that the deficiency of the CLEAR correction lies in the introduced squared MR transmit coil nonuniformity $(S_{QBC}^{Rx}(x, y, z))^2$, it is disclosed to replace the conventional quadrature-driven QBC with a multi-channel transmit coil or coil system having (again, without loss of generality)

T radio frequency (RF) transmit channels, where T is greater than or equal to two. Prior to the coil sensitivity mapping, the multi-channel transmit coil or coil system is shimmed to select amplitudes and phases for the T RF transmit channels that provide a substantially uniform transmit field. As a result, the aforementioned QBC sensitivity maps $S_{QBC}^{Tx}(x, y, z)$ and $S_{QBC}^{Rx}(x, y, z)$ are replaced by the shimmed sensitivity maps $S_{T\text{-}shimmed}^{Tx}(x, y, z)$ and $S_{T\text{-}shimmed}^{Rx}(x, y, z)$ for the shimmed multi-channel transmit coil or coil system (where subscript "T-shimmed" denotes the shimmed multi-channel transmit coil or coil system), which are expected to have substantially better spatial uniformity due to the shimming. The principle of reciprocity continues to hold, that is, $S_{T\text{-}shimmed}^{Tx}(x, y, z) \cong S_{T\text{-}shimmed}^{Rx}(x, y, z)$.

The coils sensitivity mapping is performed using the shimmed multi-channel transmit coil or coil system. Thus, the acquired intensity distributions are:

$$I_{T\text{-}shimmed}^{Rx}(x,y,z) \propto S_{T\text{-}shimmed}^{Tx} \cdot S_{T\text{-}shimmed}^{Rx} \cdot \text{Contrast} \quad (10)$$

and $$I_{i\text{-}with\text{-}shim}^{Rx} \propto S_{T\text{-}shimmed}^{Tx} \cdot S_i^{Rx} \cdot \text{Contrast} \quad (11),$$

where the spatial coordinates (x, y, z) are omitted for brevity. It will be noted that the actual sensitivity map of the MR receive element is unchanged by the transmit shimming, that is, $S_i^{Rx}(x, y, z)$ is not affected by the shimming. The ratio of Equation (5) becomes an equivalent shimmed ratio:

$$K_{i\text{-}shimmed}(x, y, z) = \frac{I_{i\text{-}with\text{-}shim}^{Rx}(x, y, z)}{I_{T\text{-}shimmed}^{Rx}(x, y, z)} = \frac{S_i^{Rx}(x, y, z)}{S_{T\text{-}shimmed}^{Rx}(x, y, z)}. \quad (12)$$

The imaging data acquisition is also performed using the shimmed multi-channel transmit coil or coil system. The term $I_{i\text{-}with\text{-}shim}^{Image}(x, y, z)$ denotes the intensity distribution acquired by the $i^{th}$ MR receive element during imaging data acquisition, using the shimmed multi-channel transmit coil or coil system. Paralleling Equation (7), $I_{i\text{-}with\text{-}shim}^{Image}(x, y, z)$ is more accurately written as:

$$I_{i\text{-}with\text{-}shim}^{Image}(x,y,z) \propto S_{T\text{-}shimmed}^{Tx}(x,y,z) \cdot S_i^{Rx}(x,y,z) \cdot \text{Contrast}(x,y,z) \quad (13),$$

This leads to the following CLEAR correction analogous to Equation (6), namely:

$$I_{i\text{-}with\text{-}shim}^{CLEAR}(x, y, z) = \frac{I_{i\text{-}with\text{-}shim}^{Image}(x, y, z)}{K_{i\text{-}shimmed}(x, y, z)}, \quad (14)$$

Combining Equations (12), (13), and (14) yields:

$$\begin{aligned} I_{i\text{-}with\text{-}shim}^{CLEAR}(x, y, z) &= \frac{I_{i\text{-}with\text{-}shim}^{Image}(x, y, z)}{K_{i\text{-}shimmed}(x, y, z)} \\ &= (I_{i\text{-}with\text{-}shim}^{Image}) \cdot \left(\frac{1}{K_{i\text{-}shimmed}}\right) \\ &= (S_{T\text{-}shimmed}^{Tx} \cdot S_i^{Rx} \cdot \text{Contrast}) \cdot \left(\frac{S_{T\text{-}shimmed}^{Rx}}{S_i^{Rx}}\right) \\ &= S_{T\text{-}shimmed}^{Tx}(x, y, z) \cdot S_{T\text{-}shimmed}^{Rx}(x, y, z) \cdot \\ &\quad \text{Contrast}(x, y, z), \end{aligned} \quad (15)$$

where the coordinate (x, y, z) is again omitted in the intermediate expressions for brevity. As $S_{T\text{-}shimmed}^{Tx}(x, y, z) \cong S_{T\text{-}shimmed}^{Rx}(x, y, z)$, Equation (15) can be written as:

$$I_{i\text{-}with\text{-}shim}^{CLEAR}(x,y,z) = (S_{T\text{-}shimmed}^{Rx}(x,y,z))^2 \cdot \text{Contrast}(x,y,z) \quad (16).$$

Equation (14) indicates the CLEAR correction is unchanged in form, but employs values obtained by mapping and imaging data acquisitions that are both performed using the shimmed multi-channel transmit coil or coil system. Equation (16) demonstrates that the CLEAR-corrected image reconstruction is substantially improved due to the substantial uniformity improvement introduced by the transmit shimming. For example, if the shimming is sufficient to reduce the transmit field uniformity by a factor of ten, then the improvement in CLEAR correction spatial uniformity is a factor of one hundred. This amplified improvement in the image is a consequence of the square in Equation (16).

Equation (9) and the analysis following therefrom is derived under the assumption that $S_{QBC}^{Tx}(x, y, z) \cong S_{QBC}^{Rx}(x, y, z)$, which is not true in all cases. Accordingly, Equation (9) is an approximation. More generally, $S_{QBC}^{Tx}(x, y, z)$ for the purpose of Equation (9) comes from the CLEAR scan itself, and can be removed (even in the general case) by RF shimming the CLEAR scan itself. The term $S_{QBC}^{Tx}(x, y, z)$ as present in the scan to determine the coil sensitivities is divided out. The real $S_{QBC}^{Rx}(x, y, z)$ in Equation (9) indeed comes from the scan to determine the coil sensitivities, but as already mentioned above the data of the elements of this coil can be combined anywhere in the process to come to the CLEAR reconstructed images.

In the following, a suitable system for implementing the foregoing improvement is set forth.

With reference to FIG. 1, a magnetic resonance (MR) scanner 10 includes a housing 12 that houses or supports components (not illustrated) such as a main magnet generating a static (B0) magnetic field and a set of magnetic field gradient coils, and an MR subject loading system 14 such as a subject couch that can be translated into and out of an imaging region which in the case of the illustrated MR scanner 10 lies within a bore 16 of the MR scanner 10. The illustrated magnetic resonance scanner 10 is an Achieva™ MR scanner available from Koninklijke Philips Electronics N.V. (Eindhoven, the Netherlands); however, substantially any MR scanner can be employed.

A multi-channel transmit coil or coil system comprising a plurality of radio frequency (RF) transmit channels 20 are provided, as shown in FIG. 1 where T RF transmit channels 20 are diagrammatically indicated, with T being an integer greater than or equal to two. The plurality of RF transmit channels 20 are operable in a multi-channel transmit mode to generate a radio frequency transmit field, sometimes denoted as a B1 transmit field. The RF frequency of the B1 transmit field is preferably at or near a magnetic resonance frequency. For a given static (B0) magnetic field, the magnetic resonance frequency is given by the product of the static magnetic field strength (|B0|) and a gyrometric constant (γ) which is a property of the nuclei intended to undergo nuclear magnetic resonance.

The multi-channel transmit coil or coil system 20 can be variously embodied. For example, in some embodiments the multi-channel transmit coil or coil system 20 is embodied as a birdcage-type volumetric radio frequency coil having I and Q ports that are independently driven, such that the number of RF transmit channels T=2 for such embodiments. In other embodiments, the multi-channel transmit coil or coil system 20 is embodied as a set of T independent coil elements, such as T independent surface coils, or T decoupled rods or rungs of a degenerate whole-body RF coil, or so forth. In these embodiments, the T independent coil elements may be variously configured, for example as separately housed coil elements, or coil elements that are electrically isolated but physically housed in a common housing (for example, a dedicated T-element coil array assembly), or so forth.

Additionally, one or more MR receive elements 22 are provided. The one or more MR receive elements 22 can comprise as few as a single receive coil (that is, N=1). To implement SENSE or another parallel imaging technique, the number of receive elements 22 should be two or more (that is, N≥2). It is also contemplated for one or more physical elements (e.g., one or more single-loop or multi-loop coils, or rods or rungs of a whole-body coil, or so forth) to serve as both transmit and receive channels through the use of suitable transmit/receive switching circuitry.

With continuing reference to FIG. 1, the MR system further includes an MR system controller and user interface module 24 by which a radiologist or other user can interface with the MR scanner 10 to cause the MR scanner 10 to acquire MR imaging data and to perform other functions such as automated loading and unloading of an imaging subject via the MR subject loading system 14. A shimming module 26 shims the multi-channel transmit coil or coil system 20 to generate shimmed RF transmit amplitude and phase parameters that are stored in a parameters storage 28. The transmit shim parameters are used for sensitivity mapping of the MR receive elements 22 performed by a coil sensitivity mapping module 30, and the resulting MR receive element coil sensitivity maps (corresponding to the parameters $K_{i\text{-shimmed}}(x, y, z)$, i=1, . . . , N of Equation (12)) are stored in a storage 32. The transmit shim parameters are also used for imaging data acquisition in order to generate imaging data that are stored in an acquired MR data storage 34. An MR image reconstruction module 36 reconstructs the image data using intensity level correction implemented using the MR receive element coil sensitivity maps $K_{i\text{-shimmed}}(x, y, z)$, i=1, . . . , N acquired with transmit shimming in order to generate a reconstructed image that is suitably stored in an images memory 38.

The processing modules 24, 26, 30, 36 are suitably embodied by a digital processor 40, which in the illustrative embodiment of FIG. 1 is the processor of a computer 42. It is to be understood that the digital processor 40 may be a plurality of processors, such as in the case of a multi-core microprocessor, a microprocessor and cooperating graphical processing unit (GPU) or math co-processor, or so forth. Moreover, the digital processor 40 may be otherwise configured, such as a dedicated processor that is not part of a computer. Still further, the various processing modules 24, 26, 30, 36 may be embodied by different processors and/or to include non-digital processor components—for example, the reconstruction module 36 may include an analog pipeline component. The user interfacing component of the MR system controller and user interface module 24 accesses suitable user interfacing hardware, such as an illustrated display 44 of the computer 42 for displaying MR scanner configuration, reconstructed images, or providing other user-perceptible output, and an illustrated keyboard 46 of the computer 42 for user input, or other user input device such as a mouse, trackball, touch-sensitive screen, or so forth for receiving user input. The various data storage components 28, 32, 34, 38 are suitably embodied as one or more storage media 48 of the computer 42, such as a hard disk drive, random access memory (RAM), or so forth. The data storage components 28, 32, 34, 38 may also be embodied by other storage media such as a network-accessible picture archiving and communications system (PACS), an external hard drive, an optical disk, or so forth.

It is also to be understood that the various processing modules 24, 26, 30, 36 can be embodied by a storage medium storing instructions that are executable by the illustrated processor 40 of the computer 42 or by another processor in order to perform the operations disclosed herein, including CLEAR-corrected imaging employing a shimmed multi-channel transmit coil or coil system. The storage medium storing such instructions may, for example, be a hard disk drive or other magnetic storage medium, or an optical disk or other optical storage medium, or a random access memory (RAM), read-only memory (ROM), flash memory or other electronic storage medium, or so forth.

With reference to FIG. 2, a constant level-corrected imaging process employing a shimmed multi-channel transmit coil or coil system is diagrammatically illustrated, which is suitably implemented by the MR system of FIG. 1. To perform the transmit field shimming, a series of operations 60, 62, 64, 66 are performed to acquire a set of (complex) B1 maps 70 for the T transmit channels of the multi-channel transmit coil or coil system 20. Toward this end, an RF transmit channel to be mapped is selected in an operation 60. In a setup operation 62, the amplitude for the selected RF transmit channel is set to 1.0 (or, more generally, to some reference amplitude or reference power level) and the relative phase for the selected RF transmit channel is set to 0° (or, more generally, to some reference phase). Also in the setup operation 62, all other (that is, the remaining T−1) RF transmit channels are turned off, for example by setting their amplitudes to 0.0. In an operation 64, for all RF transmit channels other than the selected RF transmit channel the amplitude scale is set to 0.0 and the power level is set to zero. In an acquisition operation 64, the B1 map is acquired for the selected RF transmit channel. A looping or iteration operation 66 causes the operations 60, 62, 64 to be repeated to select and map each RF transmit channel of the multi-channel transmit coil or coil system 20, so as to generate the set of (complex) B1 maps 70.

In a suitable approach for the B1 mapping operation 64, a two- or three-dimensional B1 map of a slice or volume of interest (preferably inside or coincident with the loaded imaging subject) is acquired. The B1 mapping may suitably employ RF pulses of a pre-determined target B1 amplitude or power (e.g., reference amplitude 1.0). The amplitude or power can be a fixed and typically low power level, and is optionally derived from a traditional RF drive scale determination. The B1 map should map the complex B1 values (that is, the B1 values including phase information) and represent the actual B1 values or relative B1 values that are relative to a target or nominal B1 value. The B1 map for a given RF transmit channel represents the actual transmit sensitivity of that RF transmit channel.

In the B1 mapping approach of operations 60, 62, 64, 66, the B1 map for each RF transmit channel is acquired by operating that channel alone in a B1 mapping sequence. However, other B1 mapping approaches can be used to generate the set of B1 maps 70. For example, an all-but-one mapping approach can be used, in which (for example) in each B1 mapping acquisition all transmit channels are energized except one, and the B1 mapping acquisition is repeated multiple times (equal to the number T of RF transmit channels 20) and a different transmit channel is not energized each time. In an all-but-one approach, the relative phases of each transmit channel may be initially fixed as for quadrature excitation and subsequent B1 map acquisitions set the amplitude of a different channel to zero. Variations on this approach are also suitable, in which different groups of RF transmit channels are energized using a fixed relationship and the relationship is permuted each time a B1 map is acquired until as many B1 maps have been acquired as there are independent RF transmit channels. To convert the B1 mapping data into the set of B1 maps 70 for the T transmit channels, the physical channels are mapped on to virtual channels (constructed from combinations of elements).

With continuing reference to FIG. 2, once the set of B1 maps 70 for the plurality of RF transmit channels 20 is acquired, in a computation operation 72 optimized amplitude and phase parameters are computed for the plurality of RF transmit channels of the multi-channel transmit coil or coil system 20 using the acquired B1 maps 70 to shim the multi-channel RF transmit field. In other words, the optimized amplitude and phase parameters are computed such that the multi-channel RF transmit field is substantially uniform, as measured by a suitable uniformity metric such as the coefficient of variance across a slice or volume of interest.

In an illustrative shimming process, an initial amplitude and relative phase is selected for each RF transmit channel of the multi-channel transmit coil or coil system 20. The initial amplitudes and phases are to be iteratively adjusted to iteratively improve the B1 transmit field uniformity—accordingly, the initial values are generally not critical, although having the initial values close to the final optimized values reduces the iterative computation time. In some embodiments, amplitude scale=1.0 and relative phase=0° is used as initial values for all RF transmit channels. Alternatively, if a priori information is available it can be used to set the initial values. For example, optimized amplitudes and phases determined for a previous similar subject (e.g., similar in weight, similar in body dimensions, or so forth) may be used as initial values. The B1 maps 70 are adjusted based on these initial amplitude and phase values. This can be done on a pixel-by-pixel basis by multiplying the complex B1 value by the initial amplitude scale value and shifting the B1 phase by the initial relative phase value. The thusly adjusted B1 maps are then combined to generate a B1 map that would be obtained by operating the multi-channel transmit coil or coil system 20 in a multi-channel transmit mode using the amplitude and relative phase values. This combined B1 map is assessed with respect to spatial uniformity, for example using a figure of merit such as the coefficient of variance.

If the uniformity is assessed to be unsatisfactory (for example, the computed variance is larger than an acceptable maximum variance threshold) then the amplitudes and relative phases are adjusted in an attempt to improve the figure of merit, for example by computing the partial derivatives of the variance respective to the various amplitude and phase parameters and employing a gradient-descent improvement step. The adjusted amplitudes and phases are used to compute an adjusted B1 map, whose spatial uniformity is again assessed, and this process is iterated until optimized amplitude and phase parameters are identified which suitably shim the multi-channel transmit coil or coil system 20 so as to provide satisfactory transmit field uniformity.

The foregoing iterative shimming process is an illustrative example, and other shimming processes may be employed for the operation 72. In general, any fitting method may be used which determines the optimum relative amplitude and phase parameters by which to combine the individual B1 maps 70 for minimum coefficient of variance (or as measured by another uniformity optimization criterion). A brute force approach is also contemplated, which involves sequentially iterating phase and amplitude coefficients while testing the uniformity of the combined B1 map.

The shimming operations 60, 62, 64, 66, 72 are performed by the shimming module 26 of FIG. 1, and the resulting optimized transmit channel amplitudes and phases are stored in the memory 28. When the multi-channel transmit coil or coil system 20 is operated using these optimized transmit channel amplitudes and phases, it is being operated as a shimmed multi-channel transmit coil or coil system 20, and its transmit and receive sensitivity maps are $S_{T\text{-}shimmed}^{Tx}(x, y, z)$ and $S_{T\text{-}shimmed}^{Rx}(x, y, z)$, respectively, where again the subscript "T-shimmed" denotes the shimmed multi-channel transmit coil or coil system.

A subsequent MR receive element sensitivity mapping operation 74 is then performed. This entails acquiring intensity distributions of Equations (10) and (11), namely intensity distributions $I_{i\text{-}with\text{-}shim}^{Rx}(x, y, z)$, i=1, ..., N for the N MR receive elements 22 and the intensity distribution $I_{T\text{-}shimmed}^{Rx}(x, y, z)$ acquired using the shimmed multi-channel transmit coil or coil system 20. These acquisitions use the shimmed multi-channel transmit coil or coil system 20 for the MR excitation phase. The shimmed coil sensitivities $K_{i\text{-}shimmed}(x, y, z)$ are computed in accordance with Equation (12) based on these intensity distributions. The MR receive element sensitivity mapping operation 74 is performed by the coil sensitivity mapping module 30 of FIG. 1, and the resulting shimmed coil sensitivities $K_{i\text{-}shimmed}(x, y, z)$ are stored in the memory 32.

As with the RF transmit channel B1 mappings, the MR receive element sensitivity mapping operation 74 can employ other B1 mapping approaches such as an all-but-one mapping approach in which (for example) in each B1 mapping acquisition all receive channels are used except one, using the shimmed multi-channel transmit coil or coil system 20 for the excitation phase, and the B1 mapping acquisition is repeated multiple times (equal to the number N of RF receive channels 22) and a different channel is left unused each time. To convert the B1 mapping data into a set of B1 maps for the N MR receive channels 22, the physical channels are mapped on to virtual channels (constructed from combinations of elements).

In the embodiment of FIG. 2, the MR receive element coil sensitivity mapping operation 74 is performed using the shimmed multi-channel transmit coil or coil system 20. While this is expected to provide improved results, it is also contemplated to perform the MR receive element coil sensitivity mapping operation using the multi-channel transmit coil or coil system 20 without the shimming (for example, by performing the MR receive element coil sensitivity mapping operation before performing the transmit system shimming operations 60, 62, 64, 66, 72).

With continuing reference to FIGS. 1 and 2, an imaging data acquisition operation 76 is then performed. The shimmed multi-channel transmit coil or coil system 20 is again used for MR excitation. Magnetic field gradient coils (not illustrated) of the MR scanner 10 are operated before, during, and/or after the magnetic resonance excitation in order to spatially limit and/or spatially encode or otherwise manipulate the magnetic resonance, and the magnetic resonance is received via the MR receive elements 22 and stored in the acquired MR data storage 34. In an image reconstruction operation 78, the acquired MR data are suitably reconstructed (for example, using a Fourier transform reconstruction algorithm if the acquired data are spatially encoded as Cartesian k-space samples) to generate the intensity distribution $I_{i\text{-}with\text{-}shim}^{Image}(x, y, z)$ as set forth in Equation (13), and the constant level correction is applied, for example as set forth in Equation (14), to generate the constant level-corrected image $I_{i\text{-}with\text{-}shim}^{CLEAR}(x, y, z)$ that is stored in the reconstructed MR images storage 38. The image reconstruction operation 78 may optionally also perform other reconstruction operations, such as SENSE unfolding or so forth. The resulting images, in addition to being stored in the MR images storage 38, may optionally also be displayed on the display 44 under control of the user interface component 24, or communicated via a hospital network or the Internet, or otherwise utilized.

This application has described one or more preferred embodiments. Modifications and alterations may occur to others upon reading and understanding the preceding detailed description. It is intended that the application be construed as including all such modifications and alterations insofar as they come within the scope of the appended claims or the equivalents thereof.

Having thus described the preferred embodiments, the invention is now claimed to be:

1. A magnetic resonance method comprising act of:
    shimming a multi channel transmit coil or coil system to determine optimized operating parameters for radio frequency transmit channels of the multi channel transmit coil or coil system;
    acquiring a coil sensitivity map for a magnetic resonance receive element using the multi channel transmit coil or coil system;
    acquiring magnetic resonance imaging data using the magnetic resonance receive element and the multi channel transmit coil or coil system operated with the optimized operating parameters determined by the shimming act; and
    reconstructing a magnetic resonance image from the acquired magnetic resonance imaging data, the reconstructing act including an act of performing a constant level correction using the coil sensitivity map acquired using the multi channel transmit coil or coil system operating with the optimized operating parameters determined by the shimming act,
    wherein the shimming act comprises acts of:
    acquiring a B1 map for each radio frequency transmit channel of the multi channel transmit coil or coil system; and
    selecting the optimized operating parameters including an optimized amplitude parameter and an optimized relative phase parameter for each radio frequency transmit channel such that the acquired B1 maps adjusted by the optimized amplitude and optimized relative phase parameters satisfies a uniformity criterion, and
    wherein the uniformity criterion includes a computed coefficient of variance being at or below an acceptable maximum variance threshold.

2. The magnetic resonance method as set forth in claim 1, wherein the act of acquiring a coil sensitivity map for a magnetic resonance receive element using the multi channel transmit coil or coil system comprises an act of:
    acquiring the coil sensitivity map for the magnetic resonance receive element using the multi channel transmit coil or coil system operating with the optimized operating parameters determined by the shimming act.

3. The magnetic resonance method as set forth in claim 1, wherein the selecting act selects the optimized operating parameters based on the acquired B1 maps.

4. The magnetic resonance method as set forth in claim 1, wherein the reconstructing act comprises acts of:
    reconstructing the acquired magnetic resonance imaging data to generate an uncorrected image intensity distribution; and
    correcting an intensity of the uncorrected image intensity distribution based on the coil sensitivity map acquired using the multi channel transmit coil or coil system.

5. The magnetic resonance method as set forth in claim 4, wherein correcting act comprises an act of:
    dividing the uncorrected image intensity distribution by the coil sensitivity map acquired using the multi channel transmit coil or coil system.

6. The magnetic resonance method as set forth in claim 4, wherein the correcting act comprises an act of:
    performing a constant level appearance (CLEAR) correction on the uncorrected image intensity distribution based on the coil sensitivity map acquired using the multi channel transmit coil or coil system.

7. The magnetic resonance method as set forth in claim 1, further comprising an act of:
    loading an imaging subject into a magnetic resonance scanner, the acts of shimming, acquiring a coil sensitivity map, and acquiring magnetic resonance imaging data being performed with the imaging subject loaded.

8. A magnetic resonance method comprising act of:
    shimming a multi channel transmit coil or coil system to determine optimized operating parameters for radio frequency transmit channels of the multi channel transmit coil or coil system;
    acquiring a coil sensitivity map for a magnetic resonance receive element using the multi channel transmit coil or coil system;
    acquiring magnetic resonance imaging data using the magnetic resonance receive element and the multi channel transmit coil or coil system operated with the optimized operating parameters determined by the shimming act; and
    reconstructing a magnetic resonance image from the acquired magnetic resonance imaging data, the reconstructing act including an act of performing a constant level correction using the coil sensitivity map acquired using the multi channel transmit coil or coil system operating with the optimized operating parameters determined by the shimming act,
    wherein the act of acquiring a coil sensitivity map comprises acts of:
    exciting magnetic resonance in an imaging subject using the multi channel transmit coil or coil system;
    responsive to the exciting, acquiring (i) an intensity distribution using the magnetic resonance receive element and (ii) an intensity distribution using the multi channel transmit coil or coil system; and
    computing the coil sensitivity map as a ratio of the intensity distribution acquired using the magnetic resonance receive element and the intensity distribution acquired using the multi channel transmit coil or coil system.

9. A magnetic resonance method comprising act of:
    shimming a multi channel transmit coil or coil system to determine optimized operating parameters for radio frequency transmit channels of the multi channel transmit coil or coil system;
    acquiring a coil sensitivity map for a magnetic resonance receive element using the multi channel transmit coil or coil system;
    acquiring magnetic resonance imaging data using the magnetic resonance receive element and the multi channel transmit coil or coil system operated with the optimized operating parameters determined by the shimming act; and
    reconstructing a magnetic resonance image from the acquired magnetic resonance imaging data, the reconstructing act including an act of performing a constant level correction using the coil sensitivity map acquired using the multi channel transmit coil or coil system operating with the optimized operating parameters determined by the shimming act, wherein a plurality of magnetic resonance receive elements are provided, and wherein:

the act of acquiring a coil sensitivity map comprises an act of generating a coil sensitivity map corresponding to each of the plurality of magnetic resonance receive elements using magnetic resonance data acquired using the multi channel transmit coil or coil system; and the act of acquiring magnetic resonance imaging data comprises an act of acquiring a plurality of magnetic resonance imaging data sets corresponding to the plurality of magnetic resonance receive elements using the multi channel transmit coil or coil system operated with the optimized operating parameters determined by the shimming act.

10. The magnetic resonance method as set forth in claim 9, wherein the reconstructing act comprises act of:

reconstructing a plurality of magnetic resonance images corresponding to the acquired plurality of magnetic resonance imaging data sets, the reconstructing act including an act of performing a constant level correction of each magnetic resonance image using the coil sensitivity map of the corresponding magnetic resonance receive element; and combining the plurality of magnetic resonance images to generate a final image.

11. The magnetic resonance method as set forth in claim 9, wherein the combining act comprises an act of:

performing SENSE unfolding of the plurality of magnetic resonance images corresponding to the acquired plurality of magnetic resonance imaging data sets.

12. A non-transitory computer readable medium comprising computer instructions which, when executed by a processor, configure the processor to perform the acts of:

shimming a multi channel transmit coil or coil system to determine optimized operating parameters for radio frequency transmit channels of the multi channel transmit coil or coil system;

acquiring a coil sensitivity map for a magnetic resonance receive element using the multi channel transmit coil or coil system;

acquiring magnetic resonance imaging data using the magnetic resonance receive element and the multi channel transmit coil or coil system operated with the optimized operating parameters determined by the shimming act; and reconstructing a magnetic resonance image from the acquired magnetic resonance imaging data, the reconstructing act including an act of performing a constant level correction using the coil sensitivity map acquired using the multi channel transmit coil or coil system operating with the optimized operating parameters determined by the shimming act, wherein the shimming act comprises acts of:

acquiring a B1 map for each radio frequency transmit channel of the multi channel transmit coil or coil system; and selecting the optimized operating parameters including an optimized amplitude parameter and an optimized relative phase parameter for each radio frequency transmit channel such that the acquired B1 maps adjusted by the optimized amplitude and optimized relative phase parameters satisfies a uniformity criterion, and wherein the uniformity criterion includes a computed coefficient of variance being at or below an acceptable maximum variance threshold.

13. A magnetic resonance system comprising:

a magnetic resonance scanner including a multi channel transmit coil or coil system and a magnetic resonance receive element; and a digital processor configured to perform an imaging process including acts of shimming the multi channel transmit coil or coil system, acquiring a coil sensitivity map for the magnetic resonance receive element using the multi channel transmit coil or coil system, acquiring a magnetic resonance image using the magnetic resonance receive element and the shimmed multi channel transmit coil or coil system, and performing an intensity level correction on the acquired magnetic resonance image using the coil sensitivity map to generate a corrected magnetic resonance image, wherein the shimming act comprises acts of:

acquiring a B1 map for each radio frequency transmit channel of the multi channel transmit coil or coil system; and determining optimized amplitude and phase parameters for the radio frequency transmit channels of the multi channel transmit coil or coil system such that combining the acquired B1 maps adjusted by the determined amplitude and phase parameters produces a substantially uniform B1 transmit field as measured by a uniformity figure of merit;

the shimmed multi channel transmit coil or coil system being defined as the multi channel transmit coil or coil system operated using the optimized amplitude and phase parameters.

14. The magnetic resonance system as set forth in claim 13, wherein the act of acquiring a coil sensitivity map comprises an act of acquiring a coil sensitivity map for the magnetic resonance receive element after the shimming act using the shimmed multi channel transmit coil or coil system.

15. The magnetic resonance system as set forth in claim 14, wherein the act of performing an intensity level correction comprises an act of computing:

$$I_{i-with-shim}^{CLEAR}(x, y, z) = \frac{I_{i-with-shim}^{Image}(x, y, z)}{K_{i-shimmed}(x, y, z)}$$

where $I_{i-with-shim}^{Image}(x, y, z)$ denotes the magnetic resonance image acquired using the magnetic resonance receive element and the shimmed multi channel transmit coil or coil system, $K_{i-shimmed}(x, y, z)$ denotes the coil sensitivity map for the magnetic resonance receive element acquired using the shimmed multi channel transmit coil or coil system, and $I_{i-with-shim}^{CLEAR}(x, y, z)$ denotes the corrected magnetic resonance image.

16. The magnetic resonance system as set forth in claim 13, wherein the uniformity figure of merit is a coefficient of variance figure of merit.

17. The magnetic resonance system as set forth in claim 13, wherein the act of acquiring a B1 map for each radio frequency transmit channel of the multi channel transmit coil or coil system comprises one of acts of:

acquiring a B1 map for each radio frequency transmit channel using a B1 mapping in which only that radio frequency transmit channel is operative, and acquiring B1 mapping data using an all but one process and mapping the acquired B1 mapping data to the radio frequency transmit channels of the multi channel transmit coil or coil system.

18. A magnetic resonance system comprising:
a magnetic resonance scanner including a multi channel transmit coil or coil system and a magnetic resonance receive element; and
a digital processor configured to perform an imaging process including acts of shimming the multi channel transmit coil or coil system, acquiring a coil sensitivity map for the magnetic resonance receive element using the multi channel transmit coil or coil system, acquiring a magnetic resonance image using the magnetic resonance receive element and the shimmed multi channel transmit coil or coil system, and performing an intensity level correction on the acquired magnetic resonance image using the coil sensitivity map to generate a corrected magnetic resonance image, wherein the act of acquiring a coil sensitivity map comprises acts of:

exciting magnetic resonance using the shimmed multi channel transmit coil or coil system;

acquiring, responsive to the exciting act, an intensity distribution $I_{i\text{-}with\text{-}shim}^{Rx}(x, y, z)$ using the magnetic resonance receive element and an intensity distribution $I_{T\text{-}shimmed}^{Rx}(x, y, z)$ using the shimmed multi channel transmit coil or coil system; and computing the coil sensitivity map $$K_{i\text{-}shimmed}(x, y, z) = \frac{I_{i\text{-}with\text{-}shim}^{Rx}(x, y, z)}{I_{T\text{-}shimmed}^{Rx}(x, y, z)}.$$

\* \* \* \* \*